US012771376B2

(12) United States Patent
Luo et al.

(10) Patent No.: US 12,771,376 B2
(45) Date of Patent: Oct. 20, 2026

(54) CONTINUOUS-TIME SIGMA-DELTA MODULATOR AND OFFSET CALIBRATION METHOD FOR CONTINUOUS-TIME SIGMA-DELTA MODULATOR

(71) Applicant: Chongqing GigaChip Technology Co., Ltd., Chongqing (CN)

(72) Inventors: Yongshuang Luo, Chongqing (CN); Xianjie Wan, Chongqing (CN); Youhua Wang, Chongqing (CN); Dongbing Fu, Chongqing (CN); Zhou Yu, Chongqing (CN)

(73) Assignee: Chongqing GigaChip Technology Co., Ltd., Chongqing (CN)

(*) Notice: Subject to any disclaimer, the term of this patent is extended or adjusted under 35 U.S.C. 154(b) by 106 days.

(21) Appl. No.: 18/991,707

(22) Filed: Dec. 23, 2024

(65) Prior Publication Data

US 2025/0125817 A1 Apr. 17, 2025

Related U.S. Application Data

(63) Continuation of application No. PCT/CN2023/113297, filed on Aug. 16, 2023.

(30) Foreign Application Priority Data

Jun. 26, 2023 (CN) ........................ 202310765672.0

(51) Int. Cl.
*H03M 3/00* (2006.01)

(52) U.S. Cl.
CPC ........... *H03M 3/384* (2013.01); *H03M 3/494* (2013.01)

(58) Field of Classification Search
CPC ...... H03M 3/458; H03M 1/1009; H03M 1/12; H03M 3/384; H03M 3/424; H03M 3/43; H03M 1/1004; H03M 1/1245; H03M 1/361; H03M 3/452; H03M 3/454; H03M 1/00; H03M 1/0668; H03M 1/0673; H03M 1/1023; H03M 1/1042; H03M 1/1052; H03M 1/1061; H03M 1/1085;
(Continued)

(56) References Cited

U.S. PATENT DOCUMENTS 6,127,955 A * 10/2000 Handel ............... H03M 1/1038 341/120
6,271,781 B1 * 8/2001 Pellon ................... H03M 3/388 341/143

(Continued)

*Primary Examiner* — Linh V Nguyen

(57) ABSTRACT

A continuous-time sigma-delta modulator includes a continuous-time sigma-delta modulation module, a data monitoring module, and an offset calibration module. The data monitoring module and the offset calibration module are added on the basis of the continuous-time sigma-delta modulation module. Based on a hardware architecture design of the offset calibration module and the data monitoring module, with reference to software data processing, an offset of a quantizer in the continuous-time sigma-delta modulation module can be pre-calibrated based on feedback of a signal-to-noise ratio of a digital signal and a preset calibration algorithm, to obtain an offset calibration digital code. Finally, the offset calibration digital code is input into the quantizer by using the offset calibration module, and the offset of the quantizer is finally calibrated based on the offset calibration digital code.

10 Claims, 6 Drawing Sheets

(58) Field of Classification Search
CPC ...... H03M 1/466; H03M 1/66; H03M 3/3287; H03M 3/356; H03M 3/37; H03M 3/38; H03M 3/386; H03M 3/388; H03M 3/39; H03M 3/392; H03M 3/414; H03M 3/428; H03M 3/456; H03M 3/462; H03M 3/47; H03M 3/506; H03M 7/3026; H03M 7/3031
USPC .......................................... 341/118–120, 143
See application file for complete search history.

(56) References Cited

U.S. PATENT DOCUMENTS

| | | | | |
|---|---|---|---|---|
| 6,346,898 | B1 * | 2/2002 | Melanson ........... | H03M 1/0668<br>341/143 |
| 6,975,259 | B1 * | 12/2005 | Jensen .................. | H03M 3/478<br>341/143 |
| 8,643,518 | B2 * | 2/2014 | Da Silva ............... | H03M 3/386<br>341/120 |
| 8,884,802 | B2 * | 11/2014 | Li ......................... | H03M 3/384<br>341/158 |
| 9,843,337 | B1 * | 12/2017 | Li ....................... | H03M 1/1009 |
| 9,912,343 | B1 * | 3/2018 | Li ....................... | H03M 1/1009 |
| 2010/0219998 | A1 * | 9/2010 | Oliaei ..................... | H03M 3/37<br>341/143 |
| 2012/0194370 | A1 * | 8/2012 | Rangan ................... | H03M 3/30<br>341/143 |
| 2019/0312584 | A1 * | 10/2019 | Raman .................. | H03M 3/412 |
| 2025/0167798 | A1 * | 5/2025 | Gurindagunta ..... | H03M 1/1245 |

* cited by examiner

CONTINUOUS-TIME SIGMA-DELTA MODULATOR AND OFFSET CALIBRATION METHOD FOR CONTINUOUS-TIME SIGMA-DELTA MODULATOR

CROSS REFERENCE TO RELATED APPLICATION

The present application is a continuation application of PCT Application No. PCT/CN2023/113297, filed on Aug. 16, 2023, which claims the benefit of priority to a Chinese Patent Application number CN202310765672.0, filed on Jun. 26, 2023, the disclosure of the above application is hereby incorporated by reference in its entirety for all purposes.

TECHNICAL FIELD

The present disclosure relates to the field of sigma-delta modulator technologies, and in particular, to a continuous-time sigma-delta modulator and an offset calibration method for a continuous-time sigma-delta modulator.

BACKGROUND

Continuous-time low-pass sigma-delta modulators are widely used in broadband zero intermediate frequency receivers mainly due to characteristics such as a high speed, low power consumption, a resistive input, and built-in anti-aliasing of the continuous-time low-pass sigma-delta modulators. First, for a circuit module inside a modulator, different from a conventional analog-to-digital converter, the continuous-time low-pass sigma-delta modulator does not include a sample and hold circuit, and therefore, may achieve a higher speed. In addition, an index requirement on an operational amplifier in the continuous-time low-pass sigma-delta modulator is greatly reduced. Therefore, the continuous-time low-pass sigma-delta modulator may implement lower power consumption. Second, for a module outside a modulator, the resistive input characteristic may greatly reduce a requirement on an external driver circuit, and the built-in anti-aliasing characteristic of the modulator also reduces a requirement on a front-end anti-aliasing filter. In summary, the continuous-time low-pass sigma-delta modulator simplifies the external driver and filter circuits while implementing the high speed and the low power consumption of the continuous-time low-pass sigma-delta modulator, facilitating low power consumption and high integration of an entire system.

SUMMARY

Embodiments of the present disclosure provide an offset calibration technical solution for a quantizer in a continuous-time sigma-delta modulator. A data monitoring module and an offset calibration module are added on the basis of a conventional continuous-time sigma-delta modulator. An offset of the quantizer in the continuous-time sigma-delta modulator is pre-calibrated with reference to the offset calibration module and the data monitoring module, to obtain an offset calibration digital code. Then, the offset calibration digital code is input into the quantizer by using the offset calibration module, and the offset of the quantizer is finally calibrated based on the offset calibration digital code.

To achieve the foregoing objective and other related objectives, one or more embodiments of the present disclosure provide the following technical solutions: A continuous-time sigma-delta modulator is provided, including:

a continuous-time sigma-delta modulation module, configured to receive an analog signal, and sample and quantize the analog signal, to obtain a digital signal;

a data monitoring module, connected to the continuous-time sigma-delta modulation module, and configured to: monitor the digital signal, and calculate a signal-to-noise ratio of the digital signal; and an offset calibration module, separately connected to the continuous-time sigma-delta modulation module and the data monitoring module, where the offset calibration module is configured to: perform offset pre-calibration on the continuous-time sigma-delta modulation module based on feedback of the signal-to-noise ratio of the digital signal and a preset calibration algorithm, to obtain an offset calibration digital code; and perform offset calibration on the continuous-time sigma-delta modulation module based on the offset calibration digital code.

Optionally, the continuous-time sigma-delta modulation module includes at least a fourth-order continuous-time sigma-delta modulation module, the fourth-order continuous-time sigma-delta modulation module includes two active RC resonators, one quantizer, and a plurality of current-type digital-to-analog converters, the two active RC resonators and the quantizer are successively cascaded, and the digital signal output by the quantizer passes through the plurality of current-type digital-to-analog converters and then is separately fed back to the two active RC resonators and the quantizer.

Optionally, the quantizer is further separately connected to the data monitoring module and the offset calibration module, and the offset calibration module sends an offset pre-calibration digital code or the offset calibration digital code to the quantizer.

Optionally, the signal-to-noise ratio of the digital signal output by the fourth-order continuous-time sigma-delta modulation module is higher when an offset of the quantizer is closer to zero; and the signal-to-noise ratio of the digital signal output by the fourth-order continuous-time sigma-delta modulation module is the highest when the offset of the quantizer is zero.

Optionally, when performing offset pre-calibration on the continuous-time sigma-delta modulation module based on the preset calibration algorithm, the offset calibration module is specifically configured to:

input an offset calibration analog signal into the continuous-time sigma-delta modulation module, and sample and quantize the offset calibration analog signal by using the continuous-time sigma-delta modulation module, to obtain an offset calibration digital signal;

input the offset pre-calibration digital code into the quantizer by using the offset calibration module, pre-calibrate the offset calibration digital signal based on the offset pre-calibration digital code, and calculate a signal-to-noise ratio of the pre-calibrated offset calibration digital signal by using the data monitoring module; and traverse an adjustable range of the offset pre-calibration digital code, to obtain signal-to-noise ratios of pre-calibrated offset calibration digital signals corresponding to offset pre-calibration digital codes with different values, and find a maximum value of the signal-to-noise ratios of the pre-calibrated offset calibration digital signals from the signal-to-noise ratios, where the offset pre-calibration digital code corresponding to the maximum value of the signal-to-noise ratios of the pre-calibrated offset calibration digital signals is the offset calibration digital code.

Optionally, when performing offset calibration on the continuous-time sigma-delta modulation module based on the offset calibration digital code, the offset calibration module is specifically configured to:

input the offset calibration digital code into the quantizer by using the offset calibration module, and calibrate the offset of the quantizer based on the offset calibration digital code.

An offset calibration method for a continuous-time sigma-delta modulator is provided. The continuous-time sigma-delta modulator receives an analog signal, and samples and quantizes the analog signal, to obtain a digital signal, the continuous-time sigma-delta modulator includes a quantizer, and the offset calibration method for a continuous-time sigma-delta modulator includes:

performing offset pre-calibration on the continuous-time sigma-delta modulator based on feedback of a signal-to-noise ratio of the digital signal and a preset calibration algorithm, to obtain an offset calibration digital code; and calibrating an offset of the quantizer in the continuous-time sigma-delta modulator based on the offset calibration digital code.

Optionally, the signal-to-noise ratio of the digital signal is higher when the offset of the quantizer is closer to zero; and the signal-to-noise ratio of the digital signal is the highest when the offset of the quantizer is zero.

Optionally, the step of performing offset pre-calibration on the continuous-time sigma-delta modulator based on feedback of a signal-to-noise ratio of the digital signal and a preset calibration algorithm, to obtain an offset calibration digital code includes:

inputting an offset calibration analog signal into the continuous-time sigma-delta modulator, and sampling and quantizing the offset calibration analog signal by using the continuous-time sigma-delta modulator, to obtain an offset calibration digital signal;

inputting an offset pre-calibration digital code into the quantizer, pre-calibrating the offset calibration digital signal based on the offset pre-calibration digital code, and calculating a signal-to-noise ratio of the pre-calibrated offset calibration digital signal; and traversing an adjustable range of the offset pre-calibration digital code, to obtain signal-to-noise ratios of pre-calibrated offset calibration digital signals corresponding to offset pre-calibration digital codes with different values, and finding a maximum value of the signal-to-noise ratios of the pre-calibrated offset calibration digital signals from the signal-to-noise ratios, where the offset pre-calibration digital code corresponding to the maximum value of the signal-to-noise ratios of the pre-calibrated offset calibration digital signals is the offset calibration digital code.

Optionally, the step of calibrating an offset of the quantizer in the continuous-time sigma-delta modulator based on the offset calibration digital code includes:

inputting the offset calibration digital code into the quantizer, and calibrating the offset of the quantizer based on the offset calibration digital code.

DESCRIPTION OF EMBODIMENTS

Figure 1:
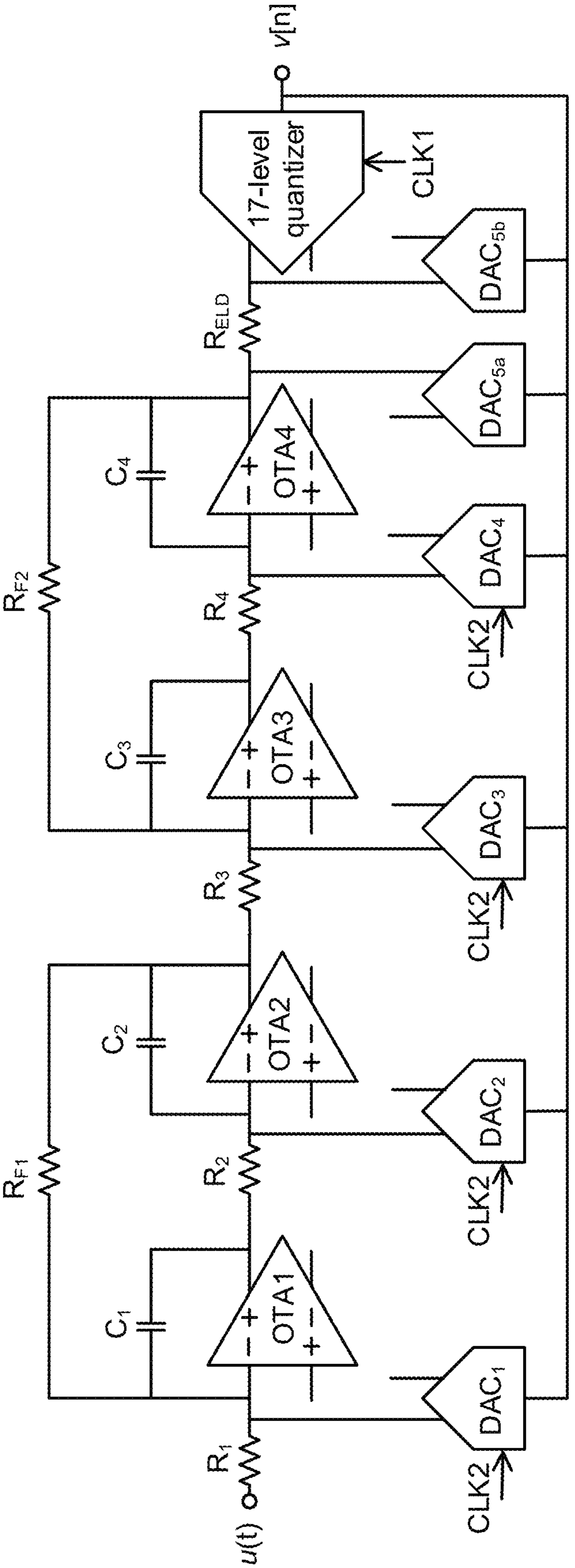
FIG. 1 is a block diagram of a circuit principle of a conventional fourth-order continuous-time low-pass sigma-delta modulator.

The following describes implementations of the present disclosure by using some specific examples. A person skilled in the art can easily understand other advantages and effects of the present disclosure based on the content disclosed in this specification. The present disclosure may be further implemented or applied by using other different specific implementations. Various details in this specification may also be modified or altered based on different viewpoints and applications without departing from the present disclosure.

Refer to FIG. 1 to FIG. 6. It should be noted that the drawings provided in the embodiments merely describe the basic concept of the present disclosure by using examples. Although the drawings show only components related to the present disclosure, and are not drawn based on a quantity of components, a shape of a component, and a size of a component during actual implementation, a shape, a quantity, and a scale of the components may be arbitrarily changed during actual implementation, and a component layout form may be more complex. The structure, scale, size, and the like shown in the drawings of this specification are merely used to cooperate with the content disclosed in this specification for a person skilled in the art to understand and read, and are not restrictions for limiting implementation of the present disclosure, and therefore have no technically substantial significance. Any modification of the structure, change of a proportional relationship, or adjustment of the size shall still fall within the scope that can be covered by the technical content disclosed in the present disclosure, provided that they do not affect the efficacy that can be generated by the present disclosure and the purpose that can be achieved by the present disclosure.

As described above in the background, continuous-time low-pass sigma-delta modulators are widely used in broadband zero intermediate frequency receivers due to performance advantages of the continuous-time low-pass sigma-delta modulators. FIG. 1 is a block diagram of a circuit principle of a fourth-order continuous-time low-pass sigma-delta modulator. The fourth-order continuous-time low-pass sigma-delta modulator receives an analog signal u(t), and samples and quantizes the analog signal u(t), to obtain a digital signal v[n]. The fourth-order continuous-time low-pass sigma-delta modulator includes two active RC resonators, one 17-level quantizer, and a plurality of current-type digital-to-analog converters $DAC_1$ to $DAC_4$, $DAC_{5a}$, and $DAC_{5b}$, the two active RC resonators and the 17-level quantizer are successively cascaded, and the active RC resonators include resistors ($R_1$ to $R_4$, $RF_1$ to $RF_2$, and $R_{ELD}$), capacitors ($C_1$ to $C_4$), and operational transconductance amplifiers (OTA1 to OTA4). For a detailed structure, refer to FIG. 1. An input terminal of a first active RC resonator receives the analog signal u(t), and an output terminal of the 17-level quantizer outputs the digital signal v[n]. The digital signal v[n] passes through the plurality of current-type digital-to-analog converters and then is separately fed back to the two active RC resonators and the 17-level quantizer. The fourth-order continuous-time low-pass sigma-delta modulator works under the control of clock signals CLK1 and CLK2.

Figure 2:
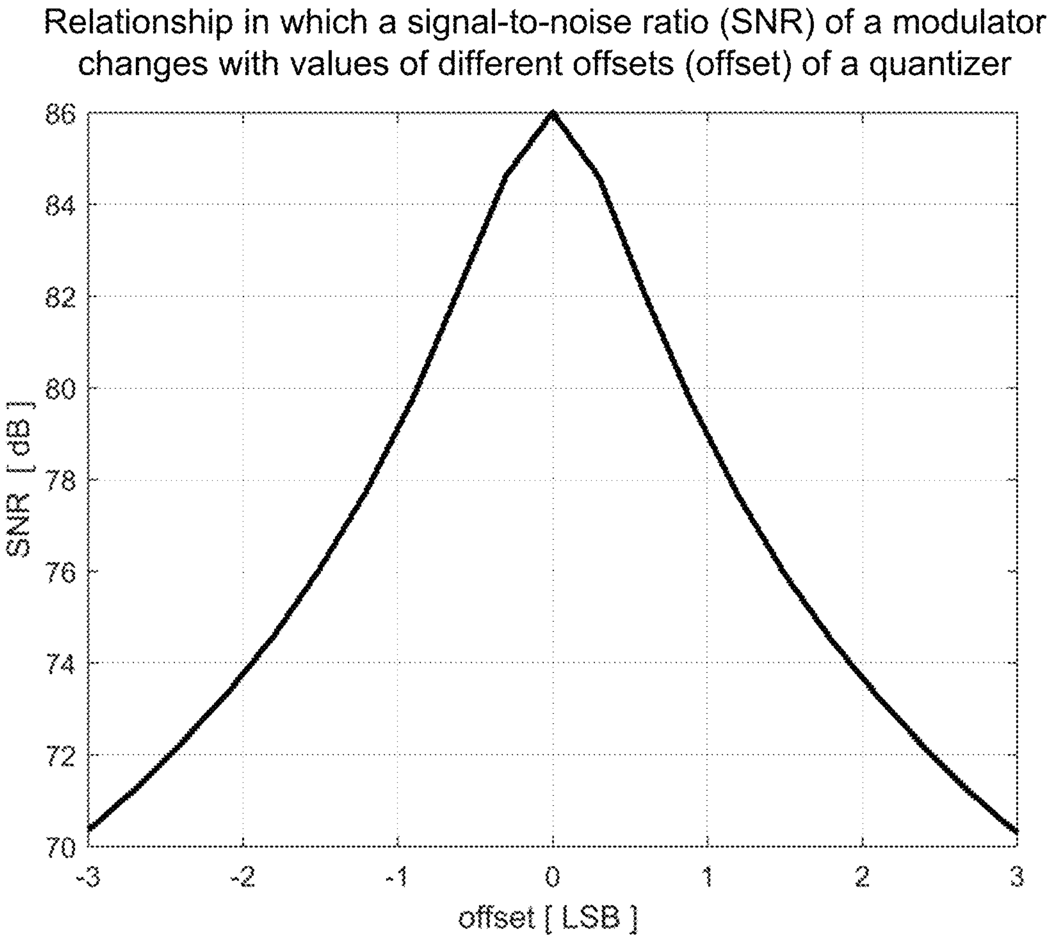
FIG. 2 shows a curve of a relationship in which a signal-to-noise ratio of an output signal of a conventional fourth-order continuous-time low-pass sigma-delta modulator changes with an offset of a quantizer.

However, many non-ideal factors need to be considered when the continuous-time low-pass sigma-delta modulator is actually designed, and an offset of a quantizer is one of the most important non-ideal factors. It is well-known that a biggest characteristic of the sigma-delta modulator is that noise shaping is performed on a quantization error generated by the quantizer. Therefore, if the quantizer has a non-zero offset, a noise floor of an output digital signal of the entire sigma-delta modulator increases on a spectrum, thereby deteriorating an output signal-to-noise ratio (SNR). A signal-to-noise ratio of the fourth-order continuous-time low-pass sigma-delta modulator shown in FIG. 1 in a range from −3 LSB to +3 LSB of the offset (offset) of the quantizer can be obtained through simulation, to better measure impact of the offset of the quantizer on the output signal-to-noise ratio of the sigma-delta modulator. A curve of such a relationship is shown in FIG. 2. It can be learned from FIG. 2 that the signal-to-noise ratio of the modulator is higher when the offset of the quantizer is closer to zero.

It can be learned from this that the offset of the quantizer affects performance and stability of an entire modulator system. An error source of the offset of the quantizer in the modulator may be incomplete symmetry in a layout design or (and) a deviation of chip manufacturing. However, in the conventional technology, the offset of the quantizer is usually optimized based on a layout. However, even if the offset of the quantizer is optimized based on a strict layout in a design, a relatively noticeable offset is finally inevitable during chip manufacturing due to a deviation of an actual production process.

Based on this, the present disclosure provides an offset calibration technical solution for a quantizer in a continuous-time sigma-delta modulator: The continuous-time sigma-delta modulator is designed with reference to a continuous-time sigma-delta modulation module, a data monitoring module, and an offset calibration module. The data monitoring module and the offset calibration module are added on the basis of the continuous-time sigma-delta modulation module. Based on a hardware architecture design of the offset calibration module and the data monitoring module, with reference to software data processing, an offset of the quantizer in the continuous-time sigma-delta modulation module is pre-calibrated based on feedback of a signal-to-noise ratio of a digital signal and a preset calibration algorithm, to obtain an offset calibration digital code. Then, the offset calibration digital code is input into the quantizer by using the offset calibration module, and the offset of the quantizer is finally calibrated based on the offset calibration digital code. The offset of the quantizer in the continuous-time sigma-delta modulation module is calibrated quickly and effectively with reference to the hardware architecture design and software data processing.

Figure 3:
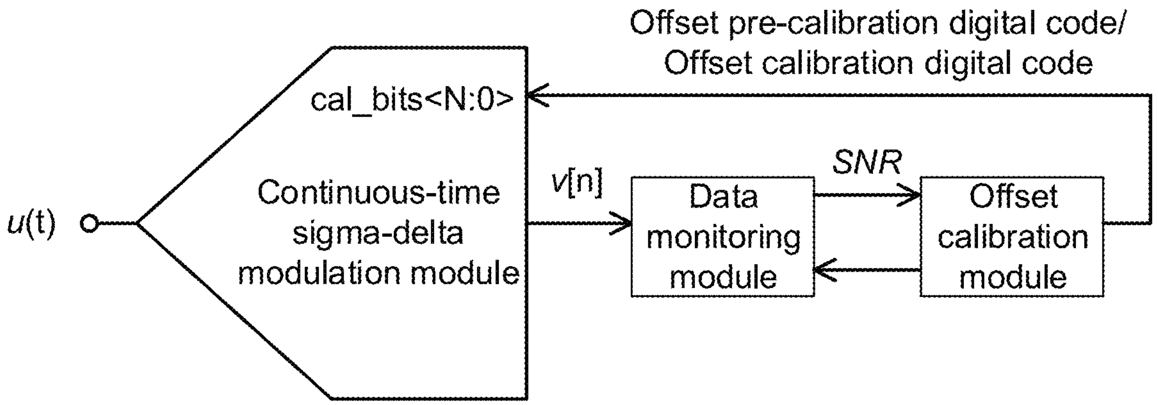
FIG. 3 is a structural block diagram of a continuous-time sigma-delta modulator according to at least one embodiment of the present disclosure.

As shown in FIG. 3, the present disclosure provides a continuous-time sigma-delta modulator, including:

a continuous-time sigma-delta modulation module, configured to receive an analog signal u(t), and sample and quantize the analog signal u(t), to obtain a digital signal v[n];

a data monitoring module, connected to the continuous-time sigma-delta modulation module, and configured to: monitor the digital signal v[n], and calculate a signal-to-noise ratio SNR of the digital signal v[n]; and an offset calibration module, separately connected to the continuous-time sigma-delta modulation module and the data monitoring module, where the offset calibration module is configured to: perform offset pre-calibration on the continuous-time sigma-delta modulation module based on feedback of the signal-to-noise ratio SNR of the digital signal v[n] and a preset calibration algorithm, to obtain an offset calibration digital code; and perform offset calibration on the continuous-time sigma-delta modulation module based on the offset calibration digital code.

In detail, the continuous-time sigma-delta modulation module includes a quantizer, the quantizer is separately connected to the data monitoring module and the offset calibration module, and the offset calibration module sends an offset pre-calibration digital code or an offset calibration digital code to the quantizer. As shown in FIG. 3, an (N+1)-bit digital code cal_bits<N: 0> is used to calibrate an offset of the quantizer. The offset calibration module sends the digital code cal_bits<N: 0> (which may be an offset pre-calibration digital code or an offset calibration digital code) to the quantizer in the continuous-time sigma-delta modulation module.

N is an integer greater than or equal to 1, and a value of N may be flexibly selected based on offset calibration precision, and is not limited herein.

Figure 4:
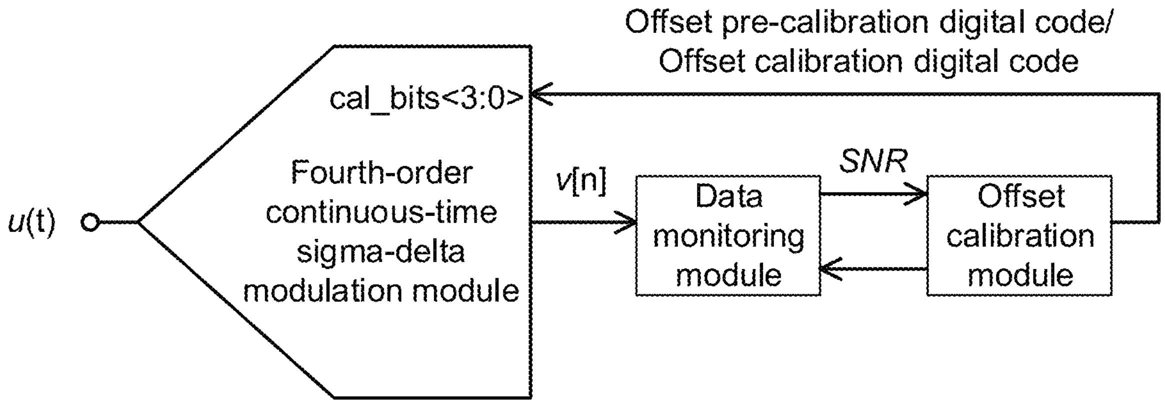
FIG. 4 is a structural block diagram of a continuous-time sigma-delta modulator according to an optional embodiment of the present disclosure.
Figure 5:
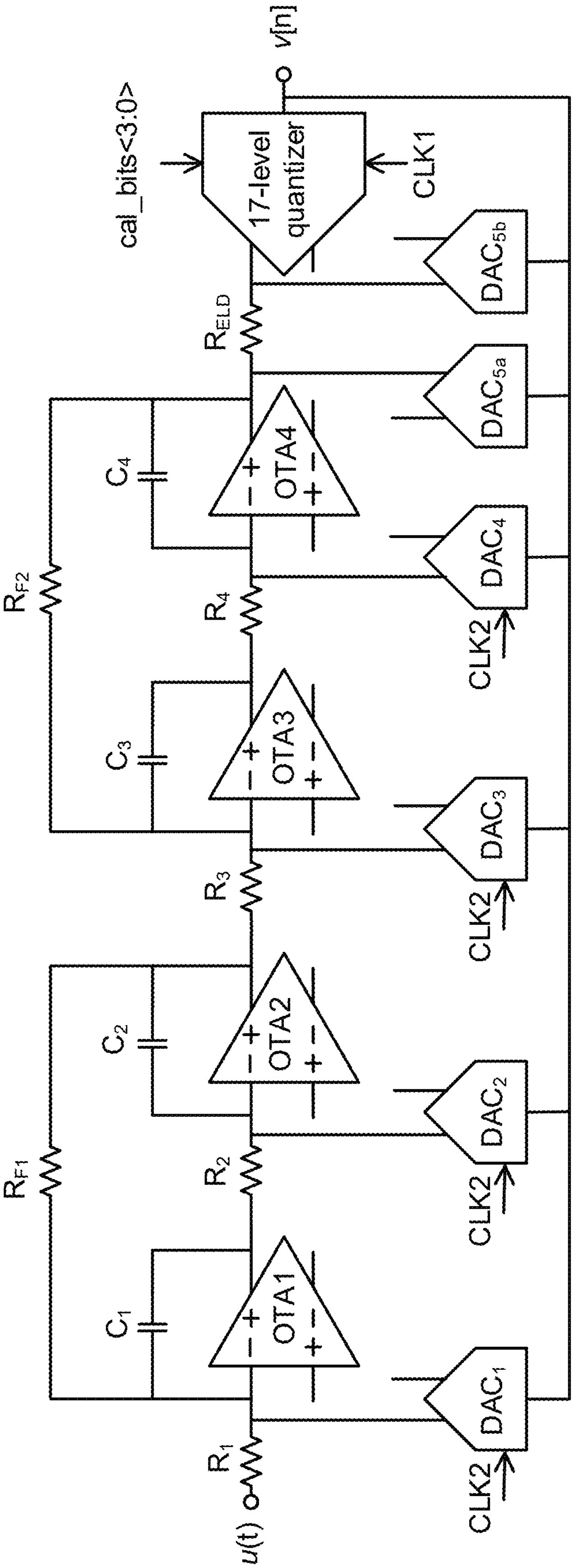
FIG. 5 is a block diagram of a circuit principle of a fourth-order continuous-time sigma-delta modulation module in FIG. 4.

In detail, the continuous-time sigma-delta modulation module includes at least a fourth-order continuous-time sigma-delta modulation module. In an optional embodiment of the present disclosure, as shown in FIG. 4 and FIG. 5, the fourth-order continuous-time sigma-delta modulation module receives an analog signal u(t), and samples and quantizes the analog signal u(t), to obtain a digital signal v[n]. The fourth-order continuous-time sigma-delta modulation module includes two active RC resonators, one 17-level quantizer, and a plurality of current-type digital-to-analog converters $DAC_1$ to $DAC_4$, $DAC_{5a}$, and $DAC_{5b}$, the two active RC resonators and the 17-level quantizer are successively cascaded, and the active RC resonators include resistors ($R_1$ to $R_4$, $RF_1$ to $RF_2$, $R_{ELD}$), capacitors ($C_1$ to $C_4$), and operational transconductance amplifiers (OTA1 to OTA4). An input terminal of a first active RC resonator receives the analog signal u(t), an output terminal of the first active RC resonator is connected to an input terminal of a second active RC resonator, an output terminal of the second active RC resonator is connected to an input terminal of the 17-level quantizer, and an output terminal of the 17-level quantizer outputs the digital signal v[n]. The digital signal v[n] passes through the plurality of current-type digital-to-analog converters and then is separately fed back to the two active RC resonators and the 17-level quantizer. The entire fourth-order continuous-time sigma-delta modulation module works under control of clock signals CLK1 and CLK2.

In more detail, as shown in FIG. 4 and FIG. 5, the quantizer in the fourth-order continuous-time sigma-delta modulation module is further separately connected to a data monitoring module and an offset calibration module, and the offset calibration module sends a four-bit digital code cal_bits<3:0> (an offset pre-calibration digital code or an offset calibration digital code) to the quantizer, to perform offset pre-calibration and offset calibration.

It may be understood that, in the present disclosure, the continuous-time sigma-delta modulation module is not limited to a fourth-order continuous-time low-pass sigma-delta modulator shown in FIG. 4 and FIG. 5, and may alternatively be a continuous-time low-pass sigma-delta modulator of another digital order (for example, a third order and a fifth order). The fourth-order continuous-time low-pass sigma-delta modulator is only used as an example for explanation herein. This is not limited in the present disclosure.

In detail, it can be learned from FIG. 2 that a signal-to-noise ratio SNR of the digital signal v[n] output by the fourth-order continuous-time sigma-delta modulation module (or any continuous-time sigma-delta modulation module) is higher when the offset (offset) of the quantizer is closer to zero; and the signal-to-noise ratio SNR of the digital signal v[n] output by the fourth-order continuous-time sigma-delta modulation module (or any continuous-time sigma-delta modulation module) is the highest when the offset (offset) of the quantizer is zero.

Based on a curve of a relationship between a signal-to-noise ratio SNR of a modulator and an offset of a quantizer shown in FIG. 2, the offset of the quantizer in the continuous-time sigma-delta modulation module is pre-calibrated based on feedback of the signal-to-noise ratio SNR of the digital signal v[n], with reference to the offset calibration module and the data monitoring module, and based on a preset calibration algorithm. First, the offset pre-calibration digital code is sent to the quantizer by using the offset calibration module, and an entire adjustable range of the offset pre-calibration digital code is traversed, to find a maximum value of the signal-to-noise ratio SNR of the digital signal v[n], so as to obtain the offset calibration digital code. Then, the offset calibration digital code is input into the quantizer by using the offset calibration module, and the offset of the quantizer is finally calibrated based on the offset calibration digital code. The offset of the quantizer in the continuous-time sigma-delta modulation module can be calibrated quickly and effectively with reference to a hardware architecture design and software data processing.

Figure 6:
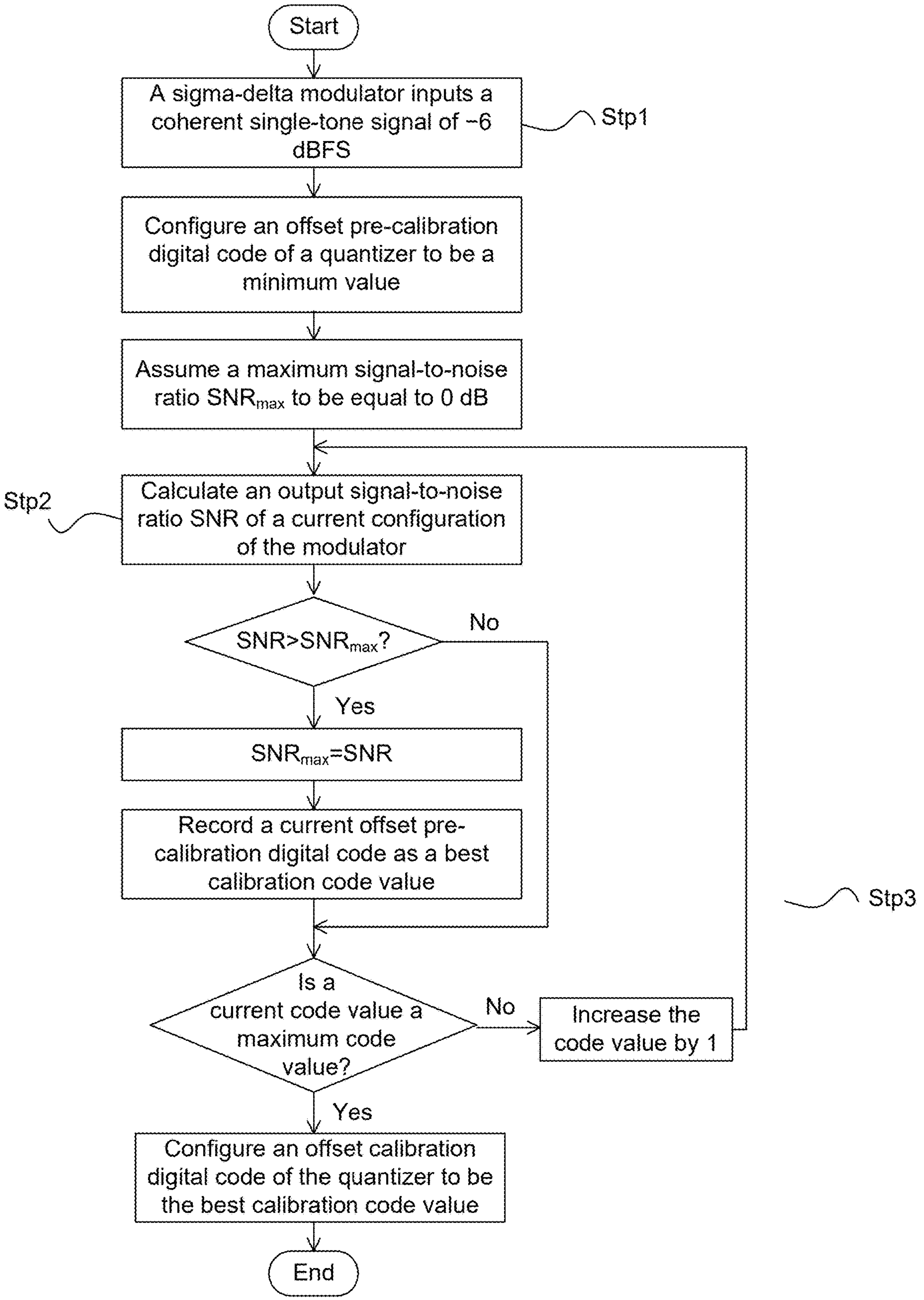
FIG. 6 is a flowchart of offset pre-calibration of a continuous-time sigma-delta modulator according to an optional embodiment of the present disclosure.

In detail, in an optional embodiment of the present disclosure, as shown in FIG. 6, when performing offset pre-calibration on the continuous-time sigma-delta modulation module based on the preset calibration algorithm, the offset calibration module is specifically configured to perform Stp1 to Stp3:

Stp1: Input an offset calibration analog signal into the continuous-time sigma-delta modulation module, and sample and quantize the offset calibration analog signal by using the continuous-time sigma-delta modulation module, to obtain an offset calibration digital signal.

Stp2: Input the offset pre-calibration digital code into the quantizer by using the offset calibration module, pre-calibrate the offset calibration digital signal based on the offset pre-calibration digital code, and calculate a signal-to-noise ratio of the pre-calibrated offset calibration digital signal by using the data monitoring module.

Stp3: Traverse the adjustable range of the offset pre-calibration digital code, to obtain signal-to-noise ratios of pre-calibrated offset calibration digital signals corresponding to offset pre-calibration digital codes with different values, and find a maximum value of signal-to-noise ratios of the pre-calibrated offset calibration digital signals from the signal-to-noise ratios, where an offset pre-calibration digital code corresponding to the maximum value of the signal-to-noise ratios of the pre-calibrated offset calibration digital signals is the offset calibration digital code.

In more detail, in Stp1, the offset calibration analog signal is first input into the continuous-time sigma-delta modulation module. The offset calibration analog signal may be a coherent single-tone signal of −6 dBFS, or may be an analog signal of another magnitude and amplitude, provided that the continuous-time sigma-delta modulation module may normally work without generating oscillation. The offset calibration analog signal is sampled and quantized by using the continuous-time sigma-delta modulation module, to obtain the offset calibration digital signal.

In more detail, in Stp2, one offset pre-calibration digital code is input into the quantizer by using the offset calibration module, the offset calibration digital signal is pre-calibrated based on the offset pre-calibration digital code, and the signal-to-noise ratio SNR of the pre-calibrated offset calibration digital signal is calculated by using the data monitoring module. In this way, one pre-calibration process is completed. One offset pre-calibration digital code is input, and a signal-to-noise ratio SNR of one digital signal is output.

In more detail, in Stp3, a code value of the offset pre-calibration digital code is changed, and Stp2 is repeated for a plurality of times, until the adjustable range of the offset pre-calibration digital code is traversed (it is assumed that the offset pre-calibration digital code has M different values, and M=2N+1), to obtain the signal-to-noise ratios SNRs of the pre-calibrated offset calibration digital signals corresponding to the offset pre-calibration digital codes with different values. N pre-calibrated processes are completed, to obtain signal-to-noise ratios SNRs of N digital signals. A maximum value SNRmax of the signal-to-noise ratios of the pre-calibrated offset calibration digital signals is found from the signal-to-noise ratios SNRs. An offset pre-calibration digital code corresponding to the maximum value SNRmax of the signal-to-noise ratios of the pre-calibrated offset calibration digital signals is the offset calibration digital code.

It should be noted that, in the embodiment described in FIG. 6, traversal is started from a minimum value of the offset pre-calibration digital code. In addition, an initial value of the maximum value SNRmax of the signal-to-noise ratios is assumed to be 0 dB, and the code value of the offset pre-calibration digital code is incrementally increased by 1 to perform traversal and screening. The entire adjustable range of the offset pre-calibration digital code is traversed (the offset pre-calibration digital code has M different values, and $M=2^{N+1}$), to find the maximum value SNRmax of the signal-to-noise ratios and the offset pre-calibration digital code corresponding to the maximum value SNRmax. It may be understood that, in another optional embodiment of the present disclosure, traversal and screening may be started from a maximum value of the offset pre-calibration digital code. This is not limited herein.

In detail, as shown in FIG. 3 to FIG. 5, when performing offset calibration on the continuous-time sigma-delta modulation module based on the offset calibration digital code, the offset calibration module is specifically configured to:

Stp4: Input the offset calibration digital code into the quantizer by using the offset calibration module, and calibrate the offset of the quantizer based on the offset calibration digital code.

In more detail, in Stp4, after receiving the offset calibration digital code, the quantizer internally performs digital-to-analog conversion on the offset calibration digital code, to obtain the offset calibration analog signal; then superimposes the offset calibration analog signal on an analog signal input by the active RC resonator, to obtain a calibrated analog signal; and finally quantizes the calibrated analog signal, to obtain the calibrated digital signal v[n]. The offset calibration digital code is fed back and superimposed, to effectively cancel out an error caused by the offset of the quantizer, and calibrate the offset of the quantizer.

Figure 7:
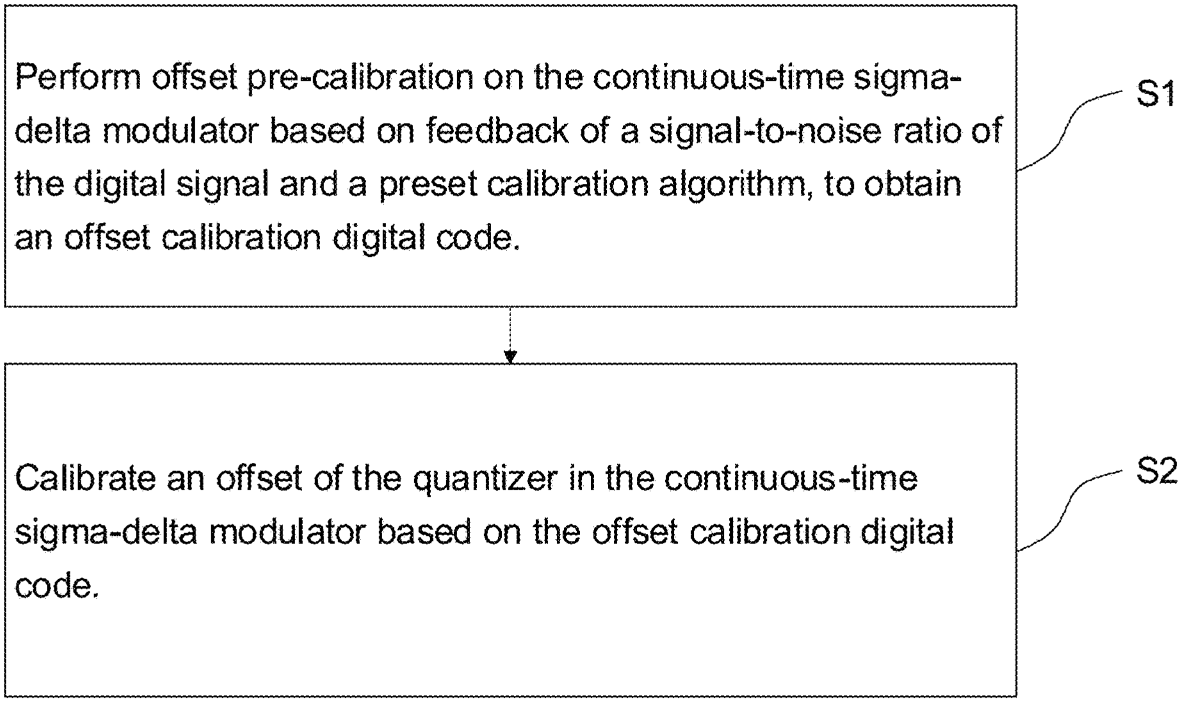
FIG. 7 is a flowchart of an offset calibration method for a continuous-time sigma-delta modulator according to an optional embodiment of the present disclosure.

Based on a design idea of the foregoing continuous-time sigma-delta modulator, as shown in FIG. 7, the present disclosure further provides an offset calibration method for a continuous-time sigma-delta modulator. The continuous-time sigma-delta modulator receives an analog signal, and samples and quantizes the analog signal, to obtain a digital signal, the continuous-time sigma-delta modulator includes a quantizer, and the offset calibration method for a continuous-time sigma-delta modulator includes:

S1: Perform offset pre-calibration on the continuous-time sigma-delta modulator based on feedback of a signal-to-noise ratio of the digital signal and a preset calibration algorithm, to obtain an offset calibration digital code.

S2: Calibrate an offset of the quantizer in the continuous-time sigma-delta modulator based on the offset calibration digital code.

Similarly, offset pre-calibration and offset calibration are performed based on a curve of a relationship between a signal-to-noise ratio SNR of the continuous-time sigma-delta modulator and an offset of the quantizer shown in FIG. 2. The signal-to-noise ratio SNR of the digital signal output by the continuous-time sigma-delta modulator is higher when the offset (offset) of the quantizer is closer to zero; and the signal-to-noise ratio SNR of the digital signal output by the continuous-time sigma-delta modulator is the highest when the offset (offset) of the quantizer is zero.

Similarly, based on the curve of the relationship between the signal-to-noise ratio SNR of the continuous-time sigma-delta modulator and the offset of the quantizer shown in FIG. 2, S1 of performing offset pre-calibration on the continuous-time sigma-delta modulator based on feedback of a signal-to-noise ratio of the digital signal and a preset calibration algorithm, to obtain an offset calibration digital code further includes:

S11: Input an offset calibration analog signal into the continuous-time sigma-delta modulator, and sample and quantize the offset calibration analog signal by using the continuous-time sigma-delta modulator, to obtain an offset calibration digital signal.

S12: Input an offset pre-calibration digital code into the quantizer, pre-calibrate the offset calibration digital signal based on the offset pre-calibration digital code, and calculate a signal-to-noise ratio of the pre-calibrated offset calibration digital signal.

S13: Traverse an adjustable range of the offset pre-calibration digital code, to obtain signal-to-noise ratios of pre-calibrated offset calibration digital signals corresponding to offset pre-calibration digital codes with different values, and find a maximum value of signal-to-noise ratios of the pre-calibrated offset calibration digital signals from the signal-to-noise ratios, where an offset pre-calibration digital code corresponding to the maximum value of the signal-to-noise ratios of the pre-calibrated offset calibration digital signals is the offset calibration digital code.

S11 to S13 are similar to Stp1 to Stp3. For details, refer to the foregoing descriptions of Stp1 to Stp3. Details are not described herein again.

Similarly, S2 of calibrating an offset of the quantizer in the continuous-time sigma-delta modulator based on the offset calibration digital code includes: inputting the offset calibration digital code into the quantizer, and calibrating the offset of the quantizer based on the offset calibration digital code. S2 is similar to Stp4. For details, refer to the foregoing descriptions of Stp4. Details are not described herein again.

In conclusion, according to the continuous-time sigma-delta modulator and the offset calibration method for a continuous-time sigma-delta modulator provided in the present disclosure, the continuous-time sigma-delta modulator is designed with reference to the continuous-time sigma-delta modulation module, the data monitoring module, and the offset calibration module. The data monitoring module and the offset calibration module are added on the basis of the continuous-time sigma-delta modulation module. Based on the hardware architecture design of the offset calibration module and the data monitoring module, with reference to software data processing, the offset of the quantizer in the continuous-time sigma-delta modulation module can be pre-calibrated based on feedback of the signal-to-noise ratio of the digital signal and the preset calibration algorithm, to obtain the offset calibration digital code. Finally, the offset calibration digital code is input into the quantizer by using the offset calibration module, and the offset of the quantizer is finally calibrated based on the offset calibration digital code. The offset of the quantizer in the continuous-time sigma-delta modulation module can be calibrated quickly and effectively with reference to the hardware architecture design and software data processing. In this way, different calibration amounts of chips of the continuous-time sigma-delta modulator that have different offsets can be implemented, so that all chips achieve respective best performance. In addition, a specific quantity of bits of the offset pre-calibration digital code in offset pre-calibration is flexibly adjustable. A finer signal-to-noise ratio maximum approximation can be implemented by using an offset pre-calibration digital code with more bits, so that the offset of the quantizer is better calibrated.

The foregoing embodiments merely illustrate principles and effects of the present disclosure, but are not intended to limit the present disclosure. Any person skilled in the art may modify or alter the foregoing embodiments without departing from the scope of the present disclosure. Therefore, all equivalent modifications or alterations completed by a person of ordinary skill in the art should still be covered by the claims of the present disclosure.

What is claimed is:

1. A continuous-time sigma-delta modulator, comprising:

a continuous-time sigma-delta modulation module, configured to receive an analog signal, and sample and quantize the analog signal, to obtain a digital signal;

a data monitoring module, connected to the continuous-time sigma-delta modulation module, and configured to: monitor the digital signal, and calculate a signal-to-noise ratio of the digital signal; and an offset calibration module, separately connected to the continuous-time sigma-delta modulation module and the data monitoring module, wherein the offset calibration module is configured to: perform offset pre-calibration on the continuous-time sigma-delta modulation module based on feedback of the signal-to-noise ratio of the digital signal and a preset calibration algorithm, to obtain an offset calibration digital code; and perform offset calibration on the continuous-time sigma-delta modulation module based on the offset calibration digital code.

2. The continuous-time sigma-delta modulator according to claim 1, wherein the continuous-time sigma-delta modulation module comprises at least a fourth-order continuous-time sigma-delta modulation module, the fourth-order continuous-time sigma-delta modulation module comprises two active RC resonators, one quantizer, and a plurality of current-type digital-to-analog converters, the two active RC resonators and the quantizer are successively cascaded, and the digital signal output by the quantizer passes through the plurality of current-type digital-to-analog converters and then is separately fed to the two active RC resonators and the quantizer.

3. The continuous-time sigma-delta modulator according to claim 2, wherein the quantizer is further separately connected to the data monitoring module and the offset calibration module, and the offset calibration module sends an offset pre-calibration digital code or the offset calibration digital code to the quantizer.

4. The continuous-time sigma-delta modulator according to claim 3, wherein the signal-to-noise ratio of the digital signal output by the fourth-order continuous-time sigma-delta modulation module is higher when an offset of the quantizer is closer to zero; and the signal-to-noise ratio of the digital signal output by the fourth-order continuous-time sigma-delta modulation module is the highest when the offset of the quantizer is zero.

5. The continuous-time sigma-delta modulator according to claim 4, wherein when performing offset pre-calibration on the continuous-time sigma-delta modulation module based on the preset calibration algorithm, the offset calibration module is configured to:

input an offset calibration analog signal into the continuous-time sigma-delta modulation module, and sample and quantize the offset calibration analog signal by using the continuous-time sigma-delta modulation module, to obtain an offset calibration digital signal;

input the offset pre-calibration digital code into the quantizer by using the offset calibration module, pre-calibrate the offset calibration digital signal based on the offset pre-calibration digital code, and calculate a signal-to-noise ratio of the pre-calibrated offset calibration digital signal by using the data monitoring module; and traverse an adjustable range of the offset pre-calibration digital code, to obtain signal-to-noise ratios of pre-calibrated offset calibration digital signals corresponding to offset pre-calibration digital codes with different values, and find a maximum value of the signal-to-noise ratios of the pre-calibrated offset calibration digital signals from the signal-to-noise ratios, wherein the offset pre-calibration digital code corresponding to the maximum value of the signal-to-noise ratios of the pre-calibrated offset calibration digital signals is the offset calibration digital code.

6. The continuous-time sigma-delta modulator according to claim 5, wherein when performing offset calibration on the continuous-time sigma-delta modulation module based on the offset calibration digital code, the offset calibration module is configured to:

input the offset calibration digital code into the quantizer by using the offset calibration module, and calibrate the offset of the quantizer based on the offset calibration digital code.

7. An offset calibration method for a continuous-time sigma-delta modulator, wherein the continuous-time sigma-delta modulator receives an analog signal, and samples and quantizes the analog signal, to obtain a digital signal, the continuous-time sigma-delta modulator comprises a quantizer, and the offset calibration method for the continuous-time sigma-delta modulator comprises:

performing offset pre-calibration on the continuous-time sigma-delta modulator based on feedback of a signal-to-noise ratio of the digital signal and a preset calibration algorithm, to obtain an offset calibration digital code; and calibrating an offset of the quantizer in the continuous-time sigma-delta modulator based on the offset calibration digital code.

8. The offset calibration method for the continuous-time sigma-delta modulator according to claim 7, wherein the signal-to-noise ratio of the digital signal is higher when the offset of the quantizer is closer to zero; and the signal-to-noise ratio of the digital signal is the highest when the offset of the quantizer is zero.

9. The offset calibration method for the continuous-time sigma-delta modulator according to claim 8, wherein performing offset pre-calibration on the continuous-time sigma-delta modulator based on feedback of a signal-to-noise ratio of the digital signal and a preset calibration algorithm, to obtain an offset calibration digital code comprises:

inputting an offset calibration analog signal into the continuous-time sigma-delta modulator, and sampling and quantizing the offset calibration analog signal by using the continuous-time sigma-delta modulator, to obtain an offset calibration digital signal;

inputting an offset pre-calibration digital code into the quantizer, pre-calibrating the offset calibration digital signal based on the offset pre-calibration digital code, and calculating a signal-to-noise ratio of the pre-calibrated offset calibration digital signal; and traversing an adjustable range of the offset pre-calibration digital code, to obtain signal-to-noise ratios of pre-calibrated offset calibration digital signals corresponding to offset pre-calibration digital codes with different values, and finding a maximum value of the signal-to-noise ratios of the pre-calibrated offset calibration digital signals from the signal-to-noise ratios, wherein the offset pre-calibration digital code corresponding to the maximum value of the signal-to-noise ratios of the pre-calibrated offset calibration digital signals is the offset calibration digital code.

10. The offset calibration method for the continuous-time sigma-delta modulator according to claim 9, wherein calibrating an offset of the quantizer in the continuous-time sigma-delta modulator based on the offset calibration digital code comprises:

inputting the offset calibration digital code into the quantizer, and calibrating the offset of the quantizer based on the offset calibration digital code.

* * * * *